(12) United States Patent
Nitta

(10) Patent No.: US 6,928,273 B2
(45) Date of Patent: Aug. 9, 2005

(54) RADIO TRANSMISSION APPARATUS FOR COMMUNICATION USING MICROWAVE SIGNAL

(75) Inventor: Hitoshi Nitta, Sakai (JP)

(73) Assignee: Sharp Kabushiki Kaisha, Osaka (JP)

( * ) Notice: Subject to any disclaimer, the term of this patent is extended or adjusted under 35 U.S.C. 154(b) by 497 days.

(21) Appl. No.: 10/270,559

(22) Filed: Oct. 16, 2002

(65) Prior Publication Data

US 2003/0092407 A1 May 15, 2003

(30) Foreign Application Priority Data

Oct. 16, 2001 (JP) ..................................... 2001-317914

(51) Int. Cl.$^7$ ................................................ H04B 7/00
(52) U.S. Cl. .............................. 455/127.5; 455/127.1; 455/127.2; 455/572; 455/574
(58) Field of Search ........................... 455/127.1, 127.2, 455/127.5, 572, 574

(56) References Cited

U.S. PATENT DOCUMENTS

| | | | |
|---|---|---|---|
| 5,199,110 A | * | 3/1993 | Adachi ...................... 455/126 |
| 5,566,363 A | * | 10/1996 | Senda ....................... 455/126 |
| 6,580,901 B1 | * | 6/2003 | Mochizuki ............... 455/127.1 |
| 6,617,930 B2 | * | 9/2003 | Nitta .......................... 330/297 |
| 6,798,845 B1 | * | 9/2004 | Nakajima ................... 375/297 |
| 6,807,403 B2 | * | 10/2004 | Tanaka ....................... 455/126 |

FOREIGN PATENT DOCUMENTS

| WO | 99/43083 | 8/1999 |
|---|---|---|

* cited by examiner

*Primary Examiner*—Quochien B. Vuong
*Assistant Examiner*—Christian A. Hannon
(74) *Attorney, Agent, or Firm*—Birch, Stewart, Kolasch & Birch, LLP (57) ABSTRACT

A level detection circuit detects a signal level of an intermediate frequency signal which is superposed on a DC voltage input from an input terminal and is separately extracted by an input processing circuit, and converts the same into a corresponding DC voltage for output to a transmission output control circuit. The transmission output control circuit compares the DC voltage received from the level detection circuit with a reference voltage and determines whether the intermediate frequency signal is being input. When the transmission output control circuit determines that the intermediate frequency signal is not being input, a switch circuit cuts off the power from a power control circuit to a transmission amplifying circuit. As a result, the radio transmission apparatus can prevent wasteful power consumption and can suppress a noise and a communication error when the transmission of the intermediate frequency signal is not intended.

20 Claims, 9 Drawing Sheets

RADIO TRANSMISSION APPARATUS FOR COMMUNICATION USING MICROWAVE SIGNAL

BACKGROUND OF THE INVENTION

1. Field of the Invention

The present invention relates to a radio transmission apparatus, and more particularly to a radio transmission apparatus transmitting a signal using a microwave signal from a home or a small business, in two-way communication via a broadcasting satellite or a communication satellite between a broadcasting station and the home or the small business.

2. Description of the Background Art

In recent years, a variety of radio communication systems using a microwave signal have been developed by utilizing a broadcasting satellite or a communication satellite, and a radio communication market has dramatically grown accordingly. Demands for two-way communication in the radio communication market have been increasing with the development of the internet, the introduction of BS digital broadcasting, or the like.

Conventionally, in the two-way radio communication targeting a home or the like, only signal transmission in downstream from a broadcasting station to a home is carried out via radio communication while signal transmission in upstream from a home to a broadcasting station mainly utilizes a telephone line.

Although the telephone line used in the upstream allows an efficient use of the existing infrastructure, it has a slow transmission speed and thus is not suitable for data communication with a large volume of information such as animation data or the like, which may be obstruct the upcoming, full-fledged two-way communication age. An attempt has then been made to use the satellite communication also in the upstream from a home to a broadcasting station.

Figure 8:
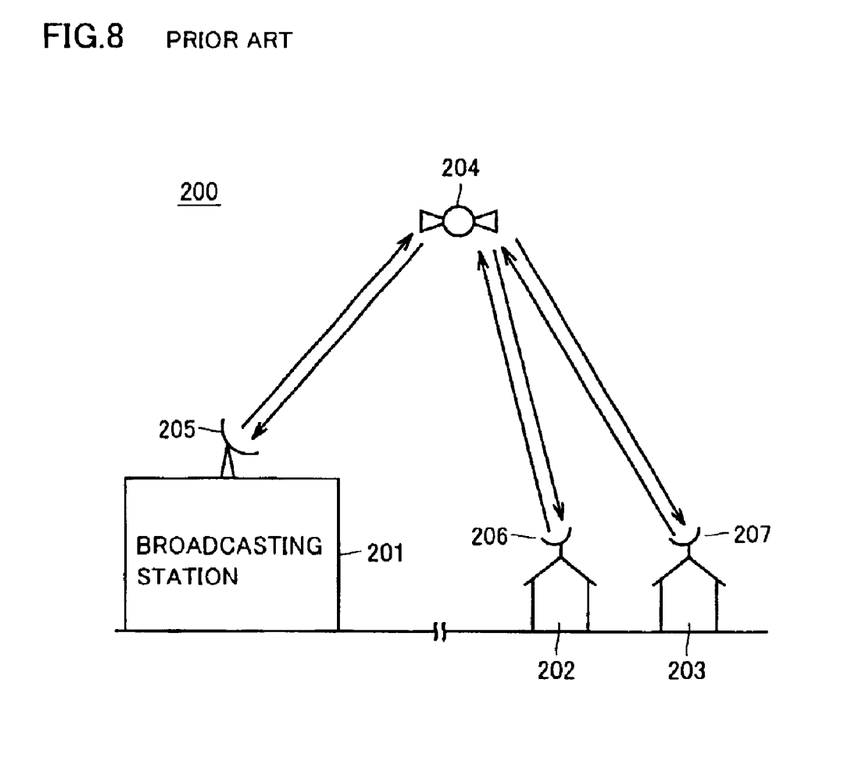
FIG. 8 is a schematic diagram conceptually illustrating a two-way communication system between each home and a broadcasting station via an artificial satellite.

FIG. 8 is a schematic diagram conceptually illustrating a two-way communication system between a broadcasting station and each home via an artificial satellite. With reference to FIG. 8, a two-way communication system 200 includes a broadcasting station 201, homes 202, 203, a satellite 204, and parabolic antennas 205–207.

Broadcasting station 201 is a base station which converts information such as image, music or the like into a microwave signal for transmission from parabolic antenna 205 to satellite 204. Broadcasting station 201 also receives information transmitted from homes 202, 203 via satellite 204.

Homes 202, 203 are users that receive and make use of the information such as image, music or the like sent from broadcasting station 201 via satellite 204. Homes 202, 203 receive the microwave signal carrying information such as image, music or the like from satellite 204 using parabolic antennas 206, 207 and convert the microwave signal into information such as image, music or the like using an LNB (Low Noise Blockdown converter) in a manner similar to the conventional satellite broadcasting receiving system. Homes 202, 203 also convert the information that the users want to transmit into a microwave signal using a radio transmission apparatus described later, and transmit that signal from parabolic antennas 206, 207 to satellite 204. The microwave for use in the two-way communication system 200 has a frequency of a 14–14.5 GHz band.

Satellite 204 is an artificial satellite that relays microwave signals between broadcasting station 201 and homes 202, 203.

Parabolic antennas 205–207 are antennas placed at broadcasting station 201 and homes 202, 203 on the earth for receiving/transmitting microwave signals from/to satellite 204.

In two-way communication system 200, broadcasting station 201 converts information such as image, music or the like into a microwave signal for transmission from parabolic antenna 205 to satellite 204. Homes 202, 203 receive the microwave signal transmitted by broadcasting station 201 from satellite 204 with parabolic antennas 206, 207 and convert the microwave signal into information such as image, music or the like using LNB for acquisition.

On the other hand, when information is sent from homes 202, 203 to broadcasting station 201, homes 202, 203 convert the information to an intermediate frequency signal at an In Door Unit (not shown), convert the intermediate frequency signal to a microwave signal using a radio transmission apparatus (described below) installed at homes 202, 203, and transmit that microwave signal from parabolic antennas 206, 207 to satellite 204. Broadcasting station 201 then receives the microwave signal via satellite 204 using parabolic antenna 205 and acquires the information sent from homes 202, 203.

Figure 9:
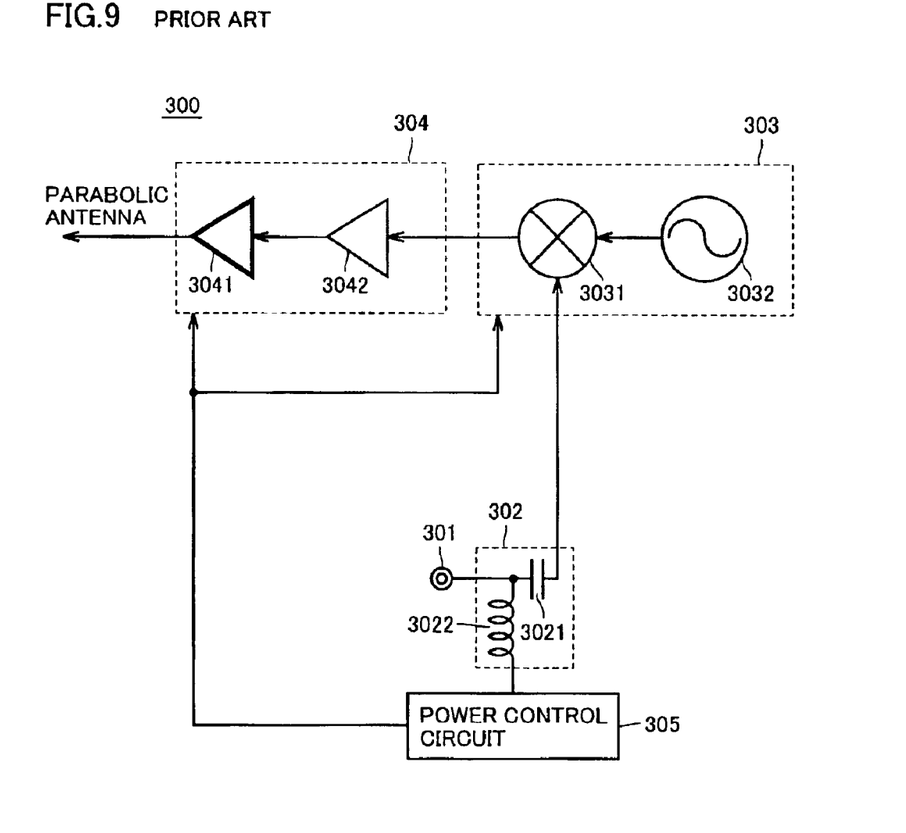
FIG. 9 is a schematic block diagram functionally illustrating a conventional radio transmission apparatus.

FIG. 9 is a schematic block diagram functionally illustrating a conventional radio transmission apparatus used at homes 202, 203 in two-way communication system 200. Referring to FIG. 9, a radio transmission apparatus 300 includes an input terminal 301, an input processing circuit 302, a frequency conversion circuit 303, a transmission power amplifying circuit 304, and a power control circuit 305. Input processing circuit 302 includes a capacitor 3021 and a coil 3022. Frequency conversion circuit 303 includes a mixer circuit 3031 and a local oscillation circuit 3032. Transmission power amplifying circuit 304 includes a power amplifier 3041 and a microwave amplifier 3042.

Input terminal 301 is a terminal inputting an intermediate frequency signal output from an In Door Unit (also abbreviated as IDU, not shown in the figure) through a coaxial cable. The intermediate frequency signal is a signal produced by modulating the information that the user wants to transmit to broadcasting station 201 into a signal having a frequency band of about 950–1450 MHz, and this intermediate frequency signal is superposed on a direct current (DC) voltage of approximately 13–26 V for input into input terminal 301.

Input processing circuit 302 separates an input voltage input to input terminal 301 into a DC voltage used as the power for radio transmission apparatus 300 and an intermediate frequency signal as a transmission signal.

Capacitor 3021 prevents the DC voltage input from input terminal 301 from being input to frequency conversion circuit 303, and separately acquires only the intermediate frequency signal from the input voltage input to input terminal 301.

Coil 3022 is provided to remove the intermediate frequency signal from the input voltage input from input terminal 301 to obtain the DC voltage used as the operating power for radio transmission apparatus 300.

Frequency conversion circuit 303 converts the intermediate frequency signal into a microwave signal having a higher frequency suitable for radio transmission.

Mixer circuit 3031 mixes the intermediate frequency signal with a local oscillation signal produced by local oscillation circuit 3032 to convert the intermediate frequency signal into the microwave signal.

Local oscillation circuit 3032 is a circuit that produces a local oscillation signal used in converting the intermediate frequency signal into the microwave signal at mixer circuit 3031.

Transmission power amplifying circuit 304 amplifies the microwave signal converted at frequency conversion circuit 303 for output to a parabolic antenna.

Power amplifier 3041 and microwave amplifier 3042 both amplify the microwave signal. The gain of power amplifier 3041, however, is limited. Microwave amplifier 3042 is thus provided prior to power amplifier 3041 in order to ensure the input level of power amplifier 3041 at a high level.

Power control circuit 305 inputs the DC voltage resulting after the intermediate frequency signal has been removed by coil 3022, and supplies the operating power to frequency conversion circuit 303 and transmission power amplifying circuit 304.

In radio transmission apparatus 300, the intermediate frequency signal superposed on the DC voltage is input from input terminal 301 to input processing circuit 302. Capacitor 3021 extracts the superposed intermediate frequency signal component from the input voltage as being input and outputs the intermediate frequency signal to frequency conversion circuit 303. Frequency conversion circuit 303 mixes the intermediate frequency signal with the local oscillation signal produced by local oscillation circuit 3032 for conversion into a microwave signal, and outputs the microwave signal to transmission power amplifying circuit 304. Transmission power amplifying circuit 304 uses microwave amplifier 3042 and power amplifier 3041 to amplify the microwave signal for output. The microwave signal output from transmission power amplifying circuit 304 is then transmitted from the parabolic antenna to satellite 204.

On the other hand, coil 3022 removes the intermediate frequency signal from the input voltage including the superposed intermediate frequency signal and outputs the DC voltage to power control circuit 305. Power control circuit 305 then converts the DC voltage resulting after the signal component has been removed to a prescribed voltage, and supplies the power to frequency conversion circuit 303 and transmission power amplifying circuit 304.

In the conventional radio transmission apparatus 300, since the DC voltage is continuously input to input terminal 301 even when the output of the intermediate frequency signal from In Door Unit is intentionally stopped, the power is supplied from power control circuit 305 to frequency conversion circuit 303 and transmission power amplifying circuit 304. As a result, even if the intermediate frequency signal is not transmitted, frequency conversion circuit 303 and transmission power amplifying circuit 304 operate, thereby causing an undesirable power consumption.

Furthermore, since transmission power amplifying circuit 304 operates even if the output of the intermediate frequency signal is intentionally stopped, a noise in a transmission frequency band is amplified and the high level noise is transmitted to the artificial satellite, thereby causing a communication error.

SUMMARY OF THE INVENTION

The present invention is therefore made to solve the above problems. An object of the present invention is to provide a power-saving radio transmission apparatus free from wasteful power consumption when the transmission of an intermediate frequency signal is not intended.

Another object of the present invention is to provide a radio transmission apparatus that suppresses a noise amplified and transmitted when the intermediate frequency signal is not transmitted, and prevents a communication error resulting from the noise.

In accordance with the present invention, a radio transmission apparatus includes: an input processing circuit separating an input voltage input with an intermediate frequency signal superposed on a DC voltage into the intermediate frequency signal and the DC voltage; a level detection circuit detecting a signal level of the separated intermediate frequency signal; a transmission circuit converting the separated intermediate frequency signal into a microwave signal and amplifying the microwave signal to be transmitted externally; a power control circuit inputting the separated DC voltage to supply power to the transmission circuit; and a transmission output control circuit. The transmission output control circuit cuts off the power to be supplied from the power control circuit to the transmission circuit when based on the signal level of the intermediate frequency signal detected by the level detection circuit it is determined that the signal level is equal to or below a prescribed value.

Preferably, the transmission circuit includes a frequency conversion circuit converting the intermediate frequency signal into the microwave signal and a transmission power amplifying circuit amplifying the microwave signal to be transmitted externally. The transmission output control circuit cuts off the power to be supplied from the power control circuit to the frequency conversion circuit and/or the transmission power amplifying circuit when it is determined that the signal level of the intermediate frequency signal detected by the level detection circuit is equal to or below the prescribed value.

Preferably, the transmission output control circuit includes a determination circuit determining whether the signal level of the intermediate frequency signal detected by the level detection circuit is equal to or below the prescribed value, and a switch circuit cutting off the power when the determination circuit determines that the signal level of the intermediate frequency signal is equal to or below the prescribed value.

In accordance with the present invention, a radio transmission apparatus includes: an input processing circuit separating an input voltage input with an intermediate frequency signal superposed on a DC voltage into the intermediate frequency signal and the DC voltage; a level detection circuit detecting a signal level of the separated intermediate frequency signal; a transmission circuit converting the separated intermediate frequency signal into a microwave signal and amplifying the microwave signal to be transmitted externally; a switching regulator circuit inputting the separated DC voltage to supply a certain power to the transmission circuit and including a switch circuit capable of cutting off the power; and a transmission output control circuit. The transmission output control circuit controls the switching regulator circuit to cut off the power to be supplied to the transmission circuit when based on the signal level of the intermediate frequency signal detected by the level detection circuit it is determined that the signal level is equal to or below a prescribed value, and the switching regulator circuit cuts off the power.

Preferably, the transmission circuit includes a frequency conversion circuit converting the intermediate frequency signal into the microwave signal, and a transmission power amplifying circuit amplifying the microwave signal to be transmitted externally. The transmission output control circuit controls the switching regulator circuit to cut off the power to be supplied to the frequency conversion circuit and/or the transmission power amplifying circuit when it is determined that the signal level of the intermediate frequency signal detected by the level detection circuit is equal to or below the prescribed value, and the switching regulator circuit cuts off the power.

Preferably, the transmission output control circuit includes a determination circuit determining whether the signal level of the intermediate frequency signal detected by the level detection circuit is equal to or below the prescribed value. The transmission output control circuit controls the switching regulator circuit to cut off the power when the determination circuit determines that the signal level of the intermediate frequency signal is equal to or below the prescribed value, and the switching regulator circuit cuts off the power using the switch circuit.

Preferably, the level detection circuit further converts the detected signal level of the intermediate frequency signal to another DC voltage in accordance with the detected signal level, and outputs the another DC voltage to the determination circuit. The determination circuit generates a prescribed reference voltage used for determining whether the intermediate frequency signal is being input, compares another DC voltage with the reference voltage, and determines that the signal level of the intermediate frequency signal is equal to or below the prescribed value when another DC voltage is equal to or below the reference voltage based on a comparison result.

Preferably, the determination circuit includes a Schmitt trigger circuit comparing another DC voltage with the reference voltage.

Preferably, the level detection circuit is an automatic gain control circuit detecting the signal level of the separated intermediate frequency signal and keeping an output level of the intermediate frequency signal constant for output.

Preferably, the transmission output control circuit further includes a timer measuring a duration time during which another DC voltage is equal to or below the reference voltage, and the timer notifies the switch circuit to cut off the power when the duration time exceeds a prescribed time period.

Preferably, the switch circuit includes an MOS transistor.

Preferably, the transmission output control circuit further includes a notifying unit providing a notification outwardly of whether the microwave signal is output from the transmission circuit.

Preferably, the notifying unit includes a light emitting diode.

Preferably, the input processing circuit includes a capacitor separately obtaining the intermediate frequency signal from the input voltage, and a coil removing the intermediate frequency signal from the input voltage and obtaining the DC voltage.

In this way, in the radio transmission apparatus in accordance with the present invention, the power to be supplied to the circuit in the radio transmission apparatus is shut off when the transmission of the intermediate frequency signal is not intended. The power is therefore not wasted, and power conservation is realized.

Furthermore, shutting-off the power to be supplied to the circuit in the radio transmission apparatus can prevent the noise which is amplified when the intermediate frequency signal is not transmitted, and thus can prevent a communication error resulting from the amplified noise.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described in detail with reference to the figures. It is noted that in the figures the same or corresponding parts will be denoted with the same reference characters and description thereof will not be repeated.

(First Embodiment)

Figure 1:
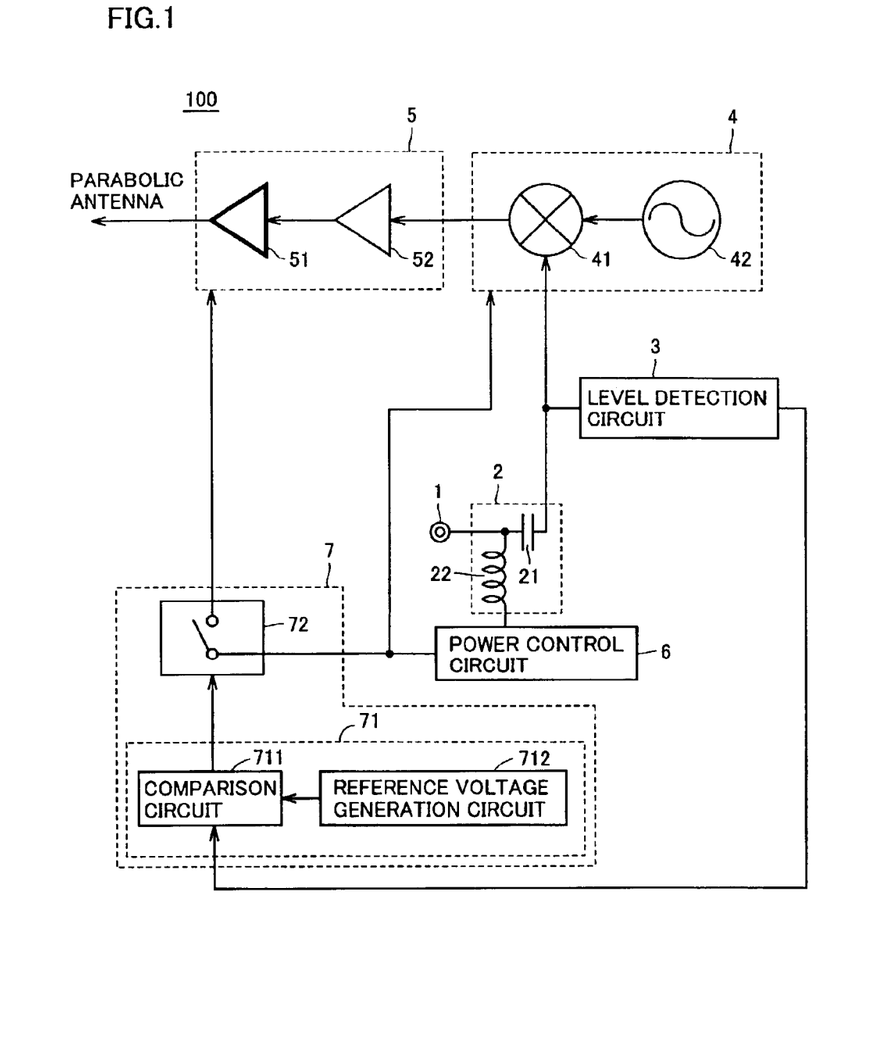
FIG. 1 is a schematic block diagram functionally illustrating a radio transmission apparatus in accordance with a first embodiment of the present invention.

Referring to FIG. 1, a radio transmission apparatus 100 in a first embodiment includes an input terminal 1, an input processing circuit 2, a level detection circuit 3, a frequency conversion circuit 4, a transmission power amplifying circuit 5, a power control circuit 6, and a transmission output control circuit 7. Input processing circuit 2 includes a capacitor 21 and a coil 22. Frequency conversion circuit 4 includes a mixer circuit 41 and a local oscillation circuit 42. Transmission power amplifying circuit 5 includes a power amplifier 51 and a microwave amplifier 52. Transmission output control circuit 7 includes a determination circuit 71 and a switch circuit 72. Determination circuit 71 includes a comparison circuit 711 and a reference voltage generation circuit 712.

Input terminal 1 inputs an intermediate frequency signal output from an indoor unit (not shown) through a coaxial cable. The intermediate frequency signal is a signal produced in the indoor unit by modulating information that the user wishes to transmit to a broadcasting station or the like into a signal having a frequency band of about 950–1450 MHz. This intermediate frequency signal is superposed on a DC voltage of about 13–26 V for input into input terminal 1.

Input processing circuit 2 separates an input voltage input to input terminal 1 into the DC voltage used as the power for radio transmission apparatus 100 and the intermediate frequency signal as a transmission signal.

Capacitor 21 prohibits the DC voltage input from input terminal 1 from being input to frequency conversion circuit 4, and separately acquires only the intermediate frequency signal from the input voltage input to input terminal 1.

Coil 22 is provided to remove the intermediate frequency signal from the input voltage input from input terminal 1 and to obtain the DC voltage used as the operating power for radio transmission apparatus 100.

Level detection circuit 3 detects an amplitude of the intermediate frequency signal separately acquired by capacitor 21 and distributed, for conversion into a DC voltage in accordance with the amplitude. Level detection circuit 3 then outputs the converted DC voltage to comparison circuit 711 in transmission output control circuit 7 described later.

Frequency conversion circuit 4 converts the intermediate frequency signal into a microwave signal having a higher frequency suitable for radio transmission.

Mixer circuit 41 mixes the intermediate frequency signal with a local oscillation signal produced by local oscillation circuit 42 and converts the intermediate frequency signal into a microwave signal.

Local oscillation circuit 42 produces a local oscillation signal used in converting the intermediate frequency signal into the microwave signal in mixer circuit 41.

Transmission power amplifying circuit 5 amplifies the microwave signal converted in frequency conversion circuit 4 for output to a parabolic antenna.

Although both power amplifier 51 and microwave amplifier 52 amplify a microwave signal, the gain of power amplifier 51 is limited. Microwave amplifier 52 is thus provided prior to power amplifier 51 in order to keep the input of power amplifier 51 at a high level.

Power control circuit 6 inputs the DC voltage resulting after the intermediate frequency signal has been removed by coil 22, and supplies the operating power to frequency conversion circuit 4 and transmission power amplifying circuit 5.

Transmission output control circuit 7 controls on/off of the power to be supplied from power control circuit 6 to transmission power amplifying circuit 5 in accordance with a signal level of the intermediate frequency signal detected by level detection circuit 3.

Determination circuit 71 compares the signal level of the intermediate frequency signal with a prescribed reference level and determines whether the intermediate frequency signal is input from the indoor unit.

Comparison circuit 711 compares the DC voltage in accordance with the signal level of the intermediate frequency signal output from level detection circuit 3 with a prescribed reference voltage generated by reference voltage generation circuit 712.

Reference voltage generation circuit 712 generates a certain reference voltage corresponding to a signal level for determining whether the intermediate frequency signal is input.

Switch circuit 72 is switched on to supply the power received from power control circuit 6 to transmission power amplifying circuit 5 when it receives from determination circuit 71 a determination result that the intermediate frequency signal is being input from the indoor unit. On the other hand, switch circuit 72 is switched off to cut off the power from power control circuit 6 to transmission power amplifying circuit 5 when it receives from determination circuit 71 a determination result that the input of the intermediate frequency signal from the indoor unit is stopped.

In radio transmission apparatus 100, the intermediate frequency signal superposed on the DC voltage is input from input terminal 1 to input processing circuit 2. Capacitor 21 extracts the superposed intermediate frequency signal component from the input voltage as being input, and outputs that component to frequency conversion circuit 4. Frequency conversion circuit 4 mixes the intermediate frequency signal with the local oscillation signal produced by local oscillation circuit 42 using mixer 41 for conversion into a microwave signal, which is output to transmission power amplifying circuit 5. Transmission power amplifying circuit 5 uses microwave amplifier 52 and power amplifier 51 to amplify the microwave signal for output. The microwave signal output from transmission power amplifying circuit 5 is then transmitted from the parabolic antenna to an artificial satellite. Since transmission power amplifying circuit 5 cannot operate when the power is not supplied from transmission output control circuit 7, the microwave signal input from frequency conversion circuit 4 is not amplified and not output to the parabolic antenna.

Meanwhile, coil 22 removes the intermediate frequency signal from the input voltage including the superposed intermediate frequency signal and outputs the DC voltage to power control circuit 6 Power control circuit 6 then converts the DC voltage resulting after the signal component has been removed into a prescribed voltage and supplies the power to frequency conversion circuit 4 and transmission power amplifying circuit 5.

Level detection circuit 3 detects the signal level of the intermediate frequency signal separately acquired from the input voltage by capacitor 21, and outputs the DC voltage in accordance with the signal level to transmission output control circuit 7. When transmission output control circuit 7 receives the DC voltage in accordance with the signal level of the intermediate frequency signal from level detection circuit 3, it compares that DC voltage with a prescribed voltage corresponding to a determination level of whether the intermediate frequency signal is being input, in comparison circuit 711. It is noted that reference voltage generation circuit 712 generates the reference voltage as described above. Determination circuit 71 determines whether the intermediate frequency signal is being input from the indoor unit in accordance with the comparison result from comparison circuit 711, and indicates switch circuit 72 to switch on when it determines that the intermediate frequency signal is being input. On the other hand, determination circuit 71 indicates switch circuit 72 to switch off when it determines the input of the intermediate frequency signal from the indoor unit is stopped.

Switch circuit 72 is switched on/off based on the indication from determination circuit 71 to supply or cut off the operating power from power control circuit 6 to transmission power amplifying circuit 5.

It is noted that although in the foregoing description, transmission power amplifying circuit 5 is subjected to the control of supply and cut-off of the operating power, frequency conversion circuit 4 may also be under the control of the operating power in addition to transmission power amplifying circuit 5 for the purpose of power conservation.

Figure 2:
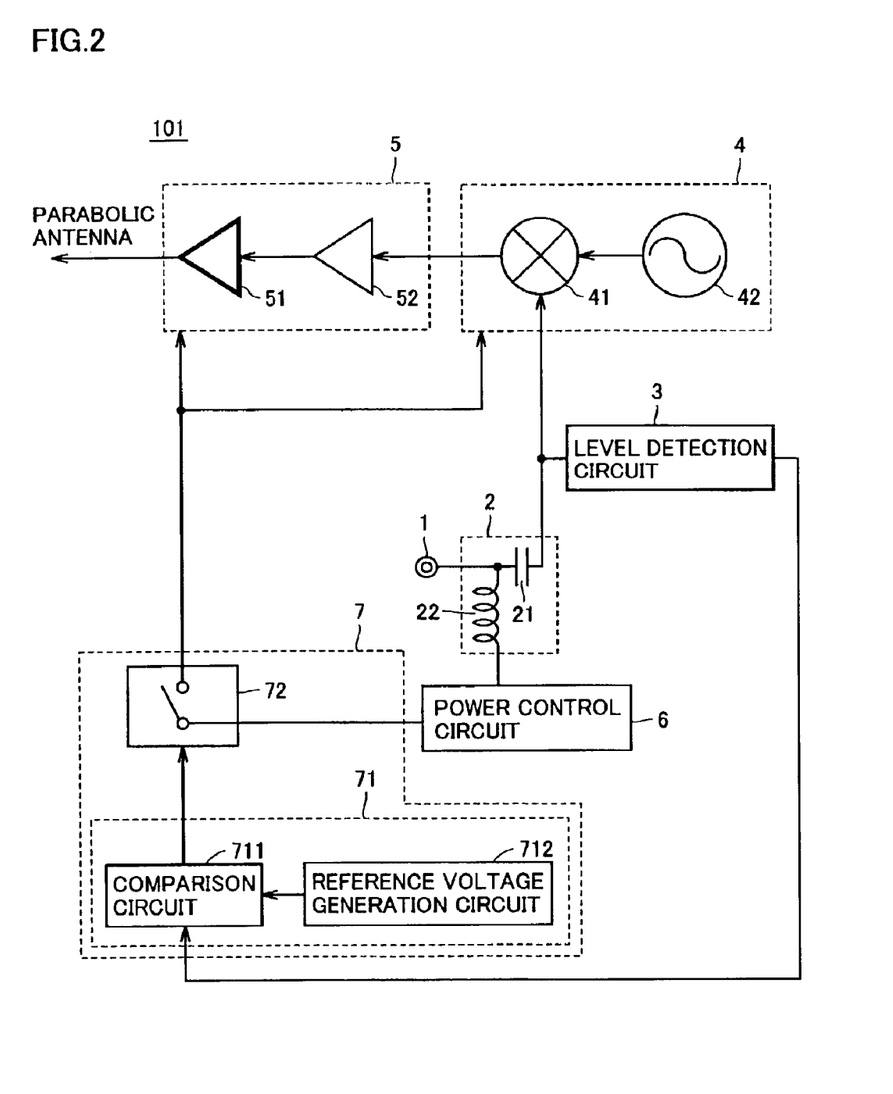
FIG. 2 is a schematic block diagram functionally illustrating another radio transmission apparatus in accordance with the first embodiment of the present invention.

FIG. 2 is a schematic block diagram of the radio transmission apparatus where frequency conversion circuit 4 is also subjected to the control of the operating power in radio transmission apparatus 100 shown in FIG. 1. Referring to FIG. 2, a radio transmission apparatus 101 is different from radio transmission apparatus 100 shown in FIG. 1 in that the power for frequency conversion circuit 4 is directly supplied from power control circuit 6 in radio transmission apparatus 100 while the power for frequency conversion circuit 4 is supplied through switch circuit 72 in transmission output control circuit 7 in radio transmission apparatus 101. In radio transmission apparatus 101, switch circuit 72 is switched on/off based on the indication from determination circuit 71 to supply or cut off the operating power from power control circuit 6 to frequency conversion circuit 4 and transmission power amplifying circuit 5.

In accordance with the first embodiment, since the power is stopped from being supplied to transmission power amplifying circuit 5 when the transmission of the intermediate frequency signal is not intended, the noise which is amplified when the intermediate frequency signal is not transmitted can be prevented and the communication error resulting from the amplified noise can be prevented.

Furthermore, since the power is stopped from being supplied to transmission power amplifying circuit 5 or frequency conversion circuit 4 when the transmission of the intermediate frequency signal is not intended, the power is not wasted, thereby realizing power conservation.

In addition, in radio transmission apparatus 101, the power is also stopped from being supplied to frequency conversion circuit 4 thereby suspending the operation, any unnecessary spurious radiation resulting from the non-linear operation of frequency conversion circuit 4 can be prevented and an adverse effect on the other high frequency equipment can be prevented.

(Second Embodiment)

Figure 3:
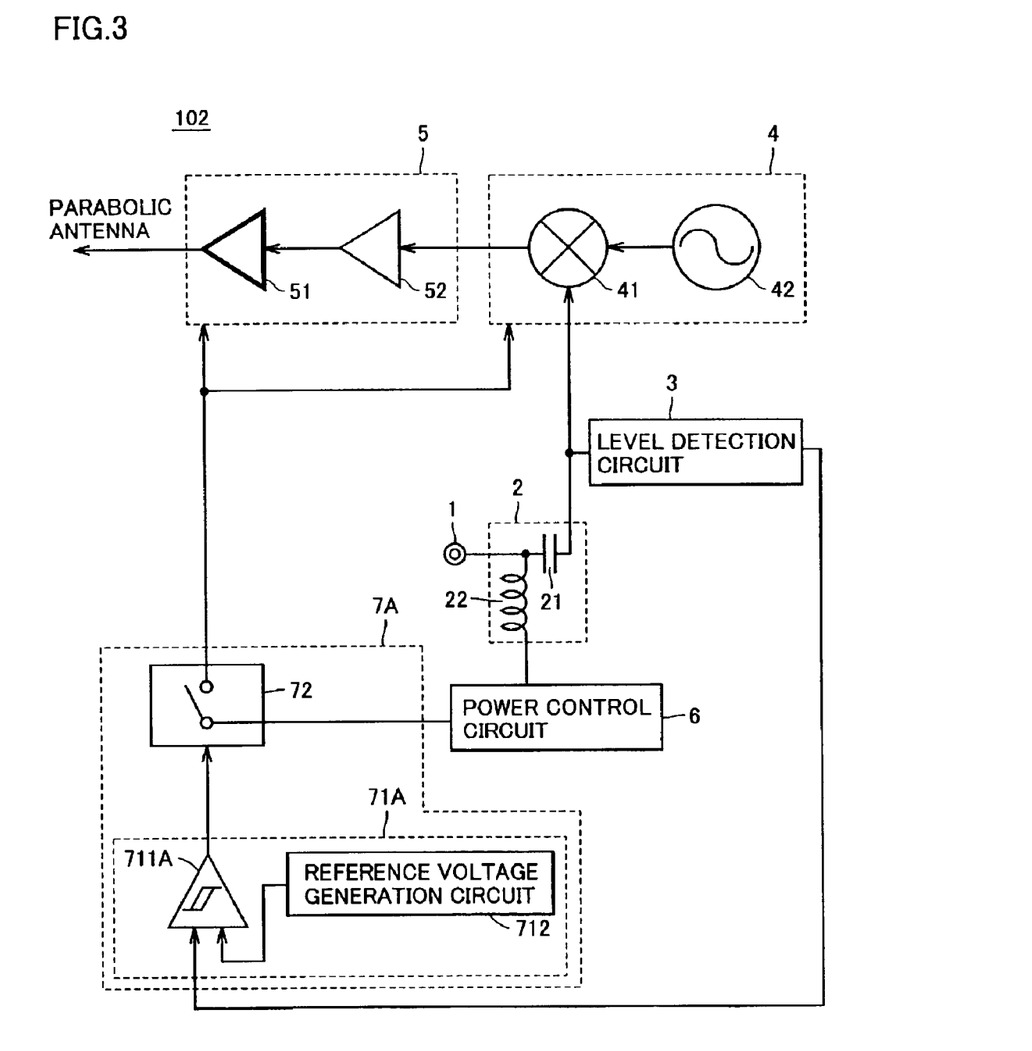
FIG. 3 is a schematic block diagram functionally illustrating a radio transmission apparatus in accordance with a second embodiment of the present invention.

Referring to FIG. 3, a radio transmission apparatus 102 in a second embodiment includes a Schmitt trigger circuit 711A in place of comparison circuit 711 included in transmission output control circuit 7 in the configuration of radio transmission apparatus 101 described in the first embodiment.

Schmitt trigger circuit 711A is used as a comparison circuit and has hysteresis characteristics in which, when the state is inverted based on a comparison result, a threshold at the time of being inverted is different from a threshold at the time of being re-inverted.

In the ordinal comparison circuit 711, a so-called chattering phenomenon may occur in which the on/off of comparison circuit 711 output is frequently repeated if the DC voltage input from level detection circuit 3 is near the reference voltage. The chattering phenomenon not only degrades switch circuit 72 but also adversely affects transmission power amplifying circuit 5 and frequency conversion circuit 4 which are supplied with the power. On the other hand, since in Schmitt trigger circuit 711A a hysterisis exists in which the thresholds differ between the time when the DC voltage input from level detection circuit 3 exceeds the reference voltage and the time when it is below the reference voltage, the chattering phenomenon is not caused, thereby leading to protection of the apparatus.

It is noted that although the foregoing description is provided based on radio transmission apparatus 101 described in the first embodiment, comparison circuit 711 may be replaced with Schmitt trigger circuit 711A in radio transmission circuit 100 in which only transmission power amplifying circuit 5 is subjected to the control of the operating power, so that the similar effect as described below can be achieved.

In accordance with the second embodiment, by using Schmitt trigger circuit 711A as a comparison circuit 711, the chattering phenomenon caused when the DC voltage in accordance with the signal level of the intermediate frequency signal is near the reference voltage can be prevented. As a result, in addition to the effect described in the first embodiment, the protection of radio transmission apparatus 102 can be further realized.

(Third Embodiment)

Figure 4:
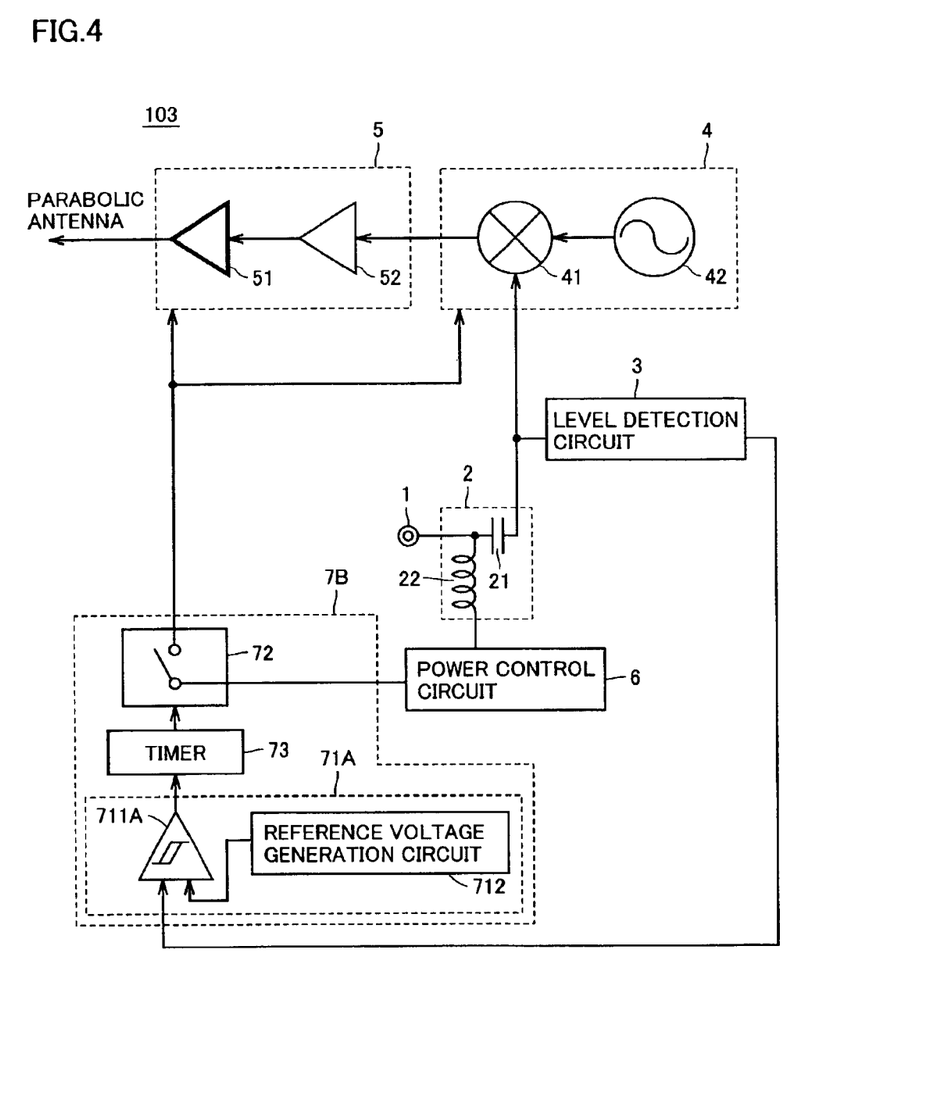
FIG. 4 is a schematic block diagram functionally illustrating a radio transmission apparatus in accordance with a third embodiment of the present invention.

Referring to FIG. 4, a radio transmission apparatus 103 in a third embodiment includes a timer 73 positioned between Schmitt trigger circuit 711A and switch circuit 72 in radio transmission apparatus 102 described in the second embodiment.

Timer 73 measures a duration time during which the DC voltage in accordance with the intermediate frequency signal is equal to or below the reference voltage. When the duration time exceeds a prescribed time period, an indication to turn the switch off is output to switch circuit 72.

In radio transmission apparatus 103, when the DC voltage in accordance with the intermediate frequency signal is equal to or below the reference voltage and Schmitt trigger circuit 711A outputs the indication to turn the switch off to switch circuit 72, that off-indication is not directly input into switch circuit 72 but input to timer 73. Timer 73 outputs the indication to turn the switch off to switch circuit 72 when the indication to turn the switch off which is received from Schmitt trigger circuit 711A has continued for a prescribed time period. This stops the operating power from being supplied from power control circuit 6 to transmission power amplifying circuit 5 and frequency conversion circuit 4.

It is noted that although the foregoing description is provided based on radio transmission apparatus 102 described in the second embodiment, timer 73 may be arranged between comparison circuit 711 and switch circuit 72 in radio transmission apparatus 100, 101 described in the first embodiment, so that the similar effect as described below can be achieved.

In accordance with the third embodiment, provision of timer 73 allows the power to transmission power amplifying circuit 5 and frequency conversion circuit 4 to be cut off when the DC voltage in accordance with the signal level of the intermediate frequency signal is below the reference voltage continuously for a prescribed time period. As a result, switch circuit 72 is not switched off and a stable operation of radio transmission apparatus 103 is attained even when the level of the intermediate frequency signal input from the indoor unit is temporally reduced or when a surge at input terminal 1 momentarily reduces the DC voltage generated in level detection circuit 3.

(Fourth Embodiment)

Figure 5:
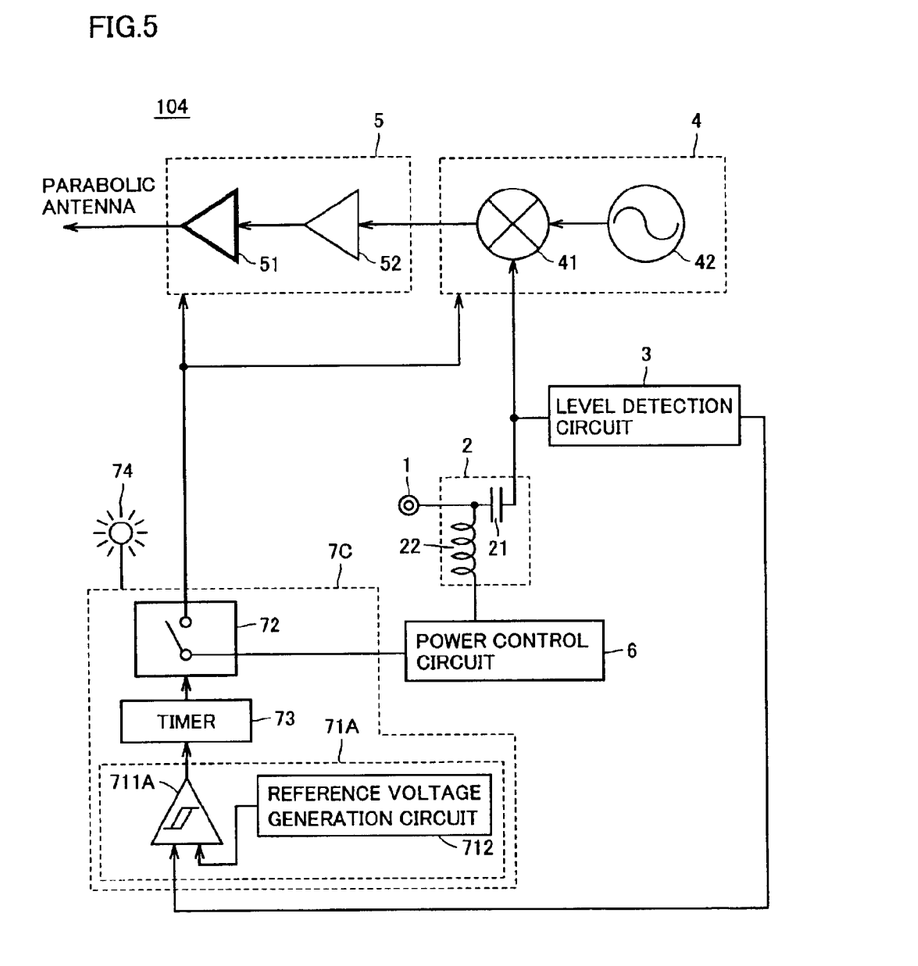
FIG. 5 is a schematic block diagram functionally illustrating a radio transmission apparatus in accordance with a fourth embodiment of the present invention.

Referring to FIG. 5, radio transmission apparatus 104 in a fourth embodiment further includes a notifying unit 74 in radio transmission apparatus 103 described in the third embodiment.

Notifying unit 74 functions to provide a notification outwardly of the control state of transmission output control circuit 7C. The microwave signal output from transmission power amplifying circuit 5 may have an adverse effect on the surroundings unexpectedly since it may have a high power of about 1W. Notifying unit 74 is formed, for example, of a light emitting diode capable of providing a notification outwardly. The light emitting diode is turned on to indicate that the microwave signal is being output when the power is supplied from power control circuit 6 to transmission power amplifying circuit 5, while the light emitting diode is turned off as the microwave signal is not being output when the power is cut off.

In radio transmission apparatus 104, when transmission output control circuit 7C determines that switch circuit 72 is switched on and the power is supplied to transmission power amplifying circuit 5, it turns on the light emitting diode as notifying unit 74. On the other hand, when transmission output control circuit 7C determines that switch circuit 72 is switched off and the power to be supplied to transmission power amplifying circuit 5 is cut off, it turns off the light emitting diode as notifying unit 74.

It is noted that although the foregoing description is provided based on radio transmission apparatus 103 described in the third embodiment, radio transmission apparatus 100, 101 described in the first embodiment may include notifying unit 74 in transmission output control circuit 7, so that the similar effect as described below can be achieved.

Alternatively, radio transmission apparatus 102 described in the second embodiment may include notifying unit 74 in transmission output control circuit 7A, or radio transmission apparatus 103 described in the third embodiment may include notifying unit 74 in transmission output control circuit 7B, so that the similar effect as described below can be achieved.

Furthermore, notifying unit 74 is not limited to a light emitting diode and it may give a notification using voice or the like.

In accordance with the fourth embodiment, since notifying unit 74 is provided in order to prevent an unexpected, adverse effect on the surroundings due to a high-power microwave signal output from transmission power amplifying circuit 5, the operating state of radio transmission apparatus 104 can be checked from the outside. In addition, when the high-power microwave signal is transmitted, an alarm may be raised not to access the surroundings of radio transmission apparatus 104.

(Fifth Embodiment)

Figure 6:
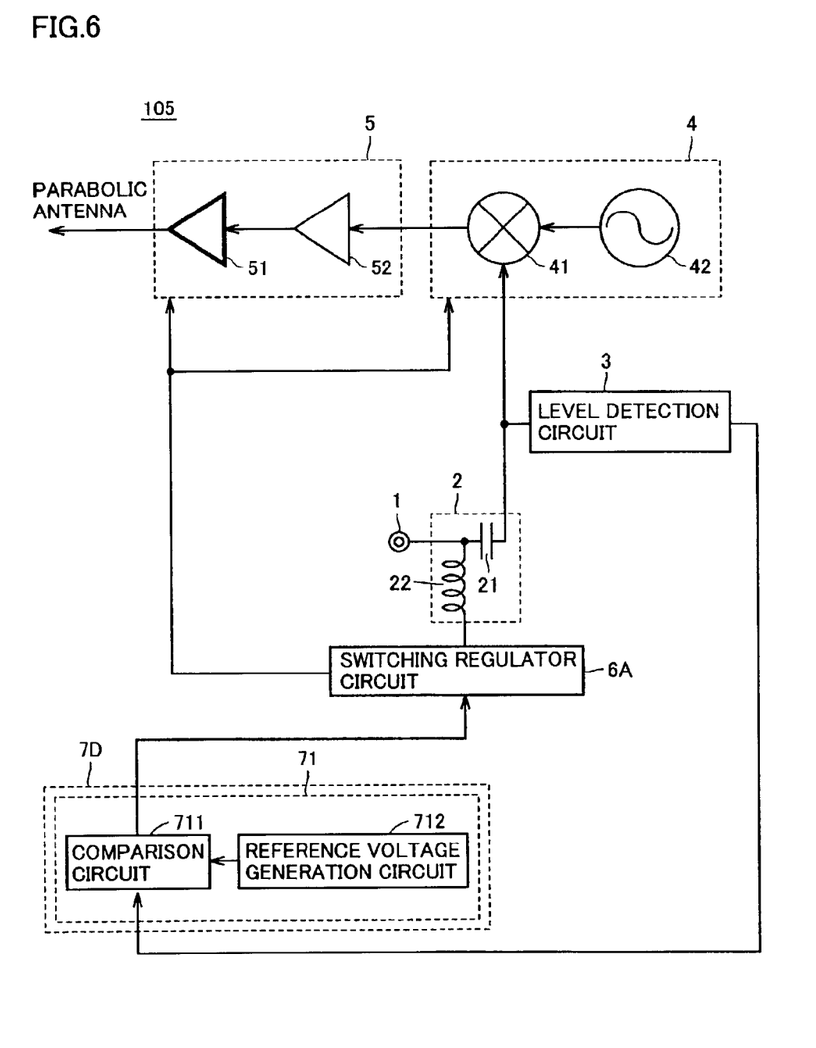
FIG. 6 is a schematic block diagram functionally illustrating a radio transmission apparatus in accordance with a fifth embodiment of the present invention.

Referring to FIG. 6, a radio transmission apparatus 105 in a fifth embodiment uses a switching regulator circuit 6A as power control circuit 6 and includes transmission output control circuit 7D in place of transmission output control circuit 7, in the configuration of radio transmission apparatus 101 described in the first embodiment.

Switching regulator circuit 6A is a DC—DC converter having an adjustment function to keep the output voltage constant irrespective of a disturbance. Furthermore, switching regulator circuit 6A has a switch function internally.

Transmission output control circuit 7D does not include switch circuit 72 in transmission output control circuit 7 described in the first embodiment, because switching regulator circuit 6A has a function to switch on/off the power, instead.

In radio transmission apparatus 105, comparison circuit 711 of transmission output control circuit 7D compares the DC voltage in accordance with the signal level of the intermediate frequency signal with the reference voltage and outputs the comparison result to switching regulator circuit 6A. Switching regulator circuit 6A uses the internal switch function to supply/cut off the operating power to transmission power amplifying circuit 5 and frequency conversion circuit 4 in accordance with the comparison result received from comparison circuit 711. More specifically, when switching regulator circuit 6A receives from comparison circuit 711 the comparison result that the signal level of the intermediate frequency signal exceeds a prescribed value, it turns the internal switch on to supply the power stabilized through the regulator function to transmission power amplifying circuit 5 and frequency conversion circuit 4.

On the other hand, when switching regulator circuit 6A receives from comparison circuit 711 the comparison result that the signal level of the intermediate frequency signal is equal to or below a prescribed value, it turns the internal switch off to cut off the operating power to be supplied to transmission power amplifying circuit 5 and frequency conversion circuit 4.

It is noted that although the forgoing description is provided based on radio transmission apparatus 101 described in the first embodiment, radio transmission apparatus 100 described in the first embodiment or radio transmission apparatuses 102–104 respectively described in the second to fourth embodiments may be configured in a manner similar to the description above, so that the similar effect as described below can be achieved.

In accordance with the fifth embodiment, since switching regulator circuit 6A which outputs the power stably irrespective of a disturbance is used as power control circuit 6, the power consumption of radio transmission apparatus 105 does not increase and power waste can be prevented even when the applied voltage input from the indoor unit to input terminal 1 is increased by the disturbance.

(Sixth Embodiment)

Figure 7:
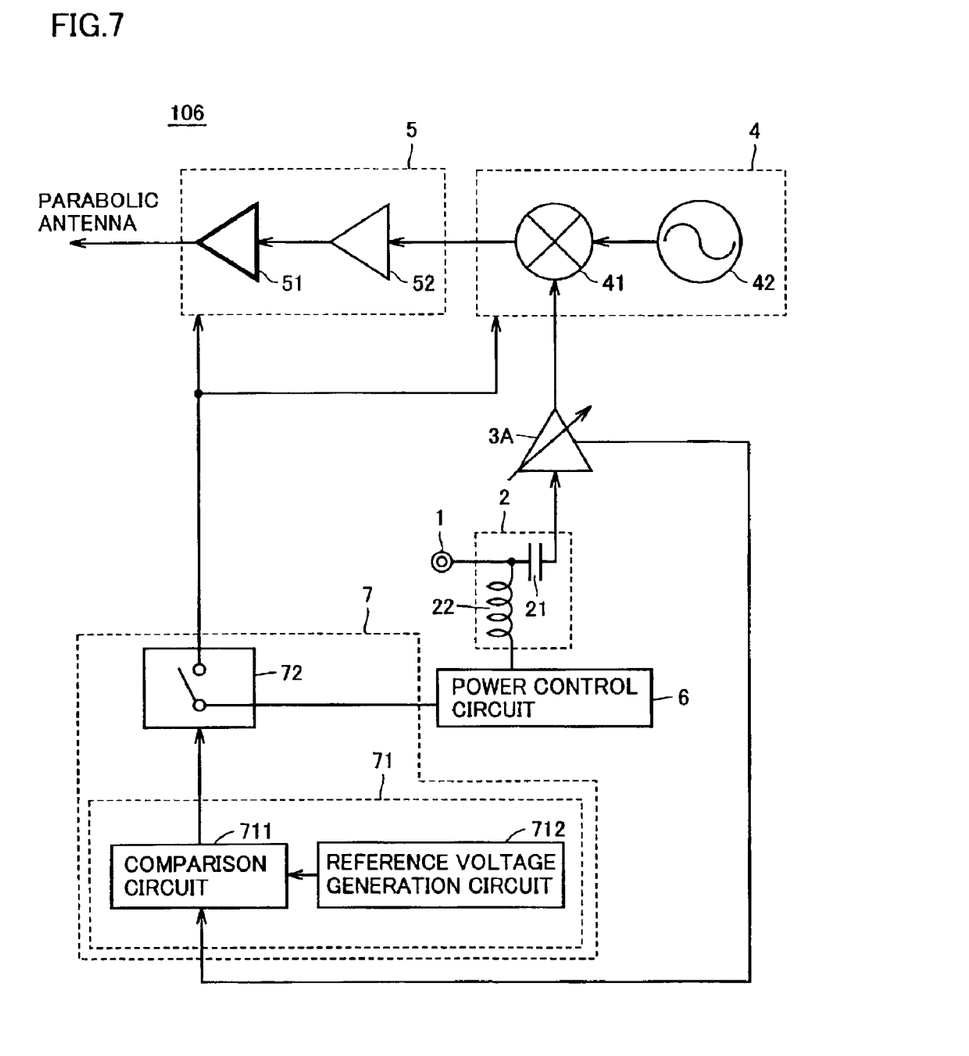
FIG. 7 is a schematic block diagram functionally illustrating a radio transmission apparatus in accordance with a sixth embodiment of the present invention.

Referring to FIG. 7, a radio transmission apparatus 106 in a sixth embodiment includes an Automatic Gain Control (abbreviated as AGC hereinafter) circuit 3A in place of level detection circuit 3, in radio transmission apparatus 101 described in the first embodiment.

AGC circuit 3A keeps a constant output level of the intermediate frequency signal output to frequency conversion circuit 4 even when the input level of the intermediate frequency signal is varied. Furthermore, since AGC circuit 3A has an internal circuit to detect an input signal, this detection circuit detects the intermediate frequency signal and outputs a DC voltage in accordance with the signal level of the detected intermediate frequency signal.

In radio transmission apparatus 106, the intermediate frequency signal superposed on the DC voltage is input from input terminal 1 to input processing circuit 2. Capacitor 21 then extracts and outputs the superposed intermediate frequency signal component from the input voltage as being input, to AGC circuit 3A. AGC circuit 3A detects the input intermediate frequency signal and generates a DC voltage in accordance with the signal level of the intermediate frequency signal. AGC circuit 3A then outputs that DC voltage to transmission output control circuit 7 and also outputs the intermediate frequency signal kept at a constant level to frequency conversion circuit 4.

Except this point, the operation has been described in the first embodiment and the description thereof will not be repeated.

It is noted that although the foregoing description is provided based on radio transmission apparatus 101 described in the first embodiment, radio transmission apparatus 100 described in the first embodiment or radio transmission apparatuses 102–105 respectively described in the second to fifth embodiments may include AGC circuit 3A in place of level detection circuit 3, so that the similar effect as described below can be achieved.

In accordance with the sixth embodiment, in addition to the effect shown in the first embodiment, since the signal level of the intermediate frequency signal is stabilized by using AGC circuit 3A, the output level of the microwave signal output from radio transmission apparatus 106 is stabilized, thereby resulting in stable communications.

It is noted that in all the embodiments described above an MOS transistor or a relay can be used in switch circuit 72. An MOS transistor is particularly appropriate as a component used in switch circuit 72 because it has a small on-resistance and has a high switching speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A radio transmission apparatus comprising:
   an input processing circuit separating an input voltage input with an intermediate frequency signal superposed on a DC voltage into said intermediate frequency signal and said DC voltage;
   a level detection circuit detecting a signal level of said separated intermediate frequency signal;
   a transmission circuit converting said separated intermediate frequency signal into a microwave signal and amplifying said microwave signal to be transmitted externally;
   a power control circuit inputting said separated DC voltage to supply power to said transmission circuit; and
   a transmission output control circuit, wherein
   said transmission output control circuit cuts off the power to be supplied from said power control circuit to said transmission circuit when based on the signal level of said intermediate frequency signal detected by said level detection circuit it is determined that said signal level is equal to or be below a prescribed value.

2. The radio transmission apparatus according to claim 1, wherein
   said transmission circuit includes
   a frequency conversion circuit converting said intermediate frequency signal to said microwave signal and
   a transmission power amplifying circuit amplifying said microwave signal to be transmitted externally, and
   said transmission output control circuit cuts off the power to be supplied from said power control circuit to said frequency conversion circuit and/or said transmission power amplifying circuit when it is determined that the signal level of said intermediate frequency signal detected by said level detection circuit is equal to or below the prescribed value.

3. The radio transmission apparatus according to claim 1, wherein
   said transmission output control circuit includes
   a determination circuit determining whether the signal level of said intermediate frequency signal detected by said level detection circuit is equal to or below the prescribed value and
   a switch circuit cutting off said power when said determination circuit determines that the signal level of said intermediate frequency signal is equal to or below the prescribed value.

4. The radio transmission apparatus according to claim 3, wherein
   said level detection circuit further converts said detected signal level of said intermediate frequency signal to another DC voltage in accordance with said detected signal level, and outputs said another DC voltage to said determination circuit, and
   said determination circuit generates a prescribed reference voltage used for determining whether said intermediate frequency signal is being input, compares said another DC voltage with said reference voltage, and determines that the signal level of said intermediate frequency signal is equal to or below the prescribed value when said another DC voltage is equal to or below said reference voltage based on a result of said comparing.

5. The radio transmission apparatus according to claim 4, wherein
   said determination circuit includes a Schmitt trigger circuit comparing said another DC voltage with said reference voltage.

6. The radio transmission apparatus according to claim 4, wherein
   said transmission output control circuit further includes a timer measuring a duration time during which said another DC voltage is equal to or below said reference voltage, and
   said timer notifies said switch circuit to cut off said power when said duration time exceeds a prescribed time period.

7. The radio transmission apparatus according to claim 3, wherein
   said switch circuit includes an MOS transistor.

8. The radio transmission apparatus according to claim 1, wherein
   said level detection circuit is an automatic gain control circuit detecting the signal level of said separated intermediate frequency signal and keeping an output level of said intermediate frequency signal constant for output.

9. The radio transmission apparatus according to claim 1, wherein
   said transmission output control circuit further includes a notifying unit providing a notification outwardly of whether said microwave signal is output from said transmission circuit.

10. The radio transmission apparatus according to claim 9, wherein
    said notifying unit includes a light emitting diode.

11. The radio transmission apparatus according to claim 1, wherein
    said input processing circuit includes
    a capacitor separately obtaining said intermediate frequency signal from said input voltage, and
    a coil removing said intermediate frequency signal from said input voltage and obtaining said DC voltage.

12. A radio transmission apparatus, comprising:
    an input processing circuit separating an input voltage input with an intermediate frequency signal superposed on a DC voltage into said intermediate frequency signal and said DC voltage;
    a level detection circuit detecting a signal level of said separated intermediate frequency signal;
    a transmission circuit converting said separated intermediate frequency signal into a microwave signal and amplifying said microwave signal to be transmitted externally;
    a switching regulator circuit inputting said separated DC voltage to supply a certain power to said transmission circuit and including a switch circuit capable of cutting off said power; and
    a transmission output control circuit, wherein
    said transmission output control circuit controls said switching regulator circuit to cut off the power to be supplied to said transmission circuit when based on the signal level of said intermediate frequency signal detected by said level detection circuit it is determined that said signal level is equal to or below a prescribed value, and said switching regulator circuit cuts off said power.

13. The radio transmission apparatus according to claim 12, wherein said transmission circuit includes a frequency conversion circuit converting said intermediate frequency signal to said microwave signal and a transmission power amplifying circuit amplifying said microwave signal to be transmitted externally, said transmission output control circuit controls said switching regulator circuit to cut off the power to be supplied to said frequency conversion circuit and/or said transmission power amplifying circuit when it is determined that the signal level of said intermediate frequency signal detected by said level detection circuit is equal to or below the prescribed value, and said switching regulator circuit cuts off said power.

14. The radio transmission apparatus according to claim 12, wherein said transmission output control circuit includes a determination circuit determining whether the signal level of said intermediate frequency signal detected by said level detection circuit is equal to or below the prescribed value, said transmission output control circuit controls said switching regulator circuit to cut off said power when said determination circuit determines that the signal level of said intermediate frequency signal is equal to or below the prescribed value, and said switching regulator circuit cuts off said power using said switch circuit.

15. The radio transmission apparatus according to claim 14, wherein said level detection circuit further converts said detected signal level of said intermediate frequency signal to another DC voltage in accordance with said detected signal level, and outputs said another DC voltage to said determination circuit, said determination circuit generates a prescribed reference voltage used for determining whether said intermediate frequency signal is being input, compares said another DC voltage with said reference voltage, and determines that the signal level of said intermediate frequency signal is equal to or below the prescribed value when said another DC voltage is equal to or below said reference voltage based on a result of said comparing.

16. The radio transmission apparatus according to claim 15, wherein said determination circuit includes a Schmitt trigger circuit comparing said another DC voltage with said reference voltage.

17. The radio transmission apparatus according to claim 15, wherein said transmission output control circuit further includes a timer measuring a duration time during which said another DC voltage is equal to or below said reference voltage, and said timer notifies said switch circuit to cut off said power when said duration time exceeds a prescribed time period.

18. The radio transmission apparatus according to claim 12, wherein said level detection circuit is an automatic gain control circuit detecting the signal level of said separated intermediate frequency signal and keeping an output level of said intermediate frequency signal constant for output.

19. The radio transmission apparatus according to claim 12, wherein said transmission output control circuit further includes a notifying unit providing a notification outwardly of whether said microwave signal is output from said transmission circuit.

20. The radio transmission apparatus according to claim 12, wherein said input processing circuit includes a capacitor separately obtaining said intermediate frequency signal from said input voltage, and a coil removing said intermediate frequency signal from said input voltage and obtaining said DC voltage.

* * * * *